US007961056B2

(12) United States Patent  
Taylor et al.

(10) Patent No.: US 7,961,056 B2  
(45) Date of Patent: Jun. 14, 2011

(54) LOW PHASE NOISE VOLTAGE CONTROLLED OSCILLATOR

(75) Inventors: Stewart S. Taylor, Beaverton, OR (US); Diptendu Ghosh, Austin, TX (US)

(73) Assignee: Intel Corporation, Santa Clara, CA (US)

(*) Notice: Subject to any disclaimer, the term of this patent is extended or adjusted under 35 U.S.C. 154(b) by 81 days.

(21) Appl. No.: 12/557,369

(22) Filed: Sep. 10, 2009

(65) Prior Publication Data

US 2011/0057732 A1 Mar. 10, 2011

(51) Int. Cl.
*H03B 5/00* (2006.01)
*H03B 5/08* (2006.01)
*H03B 5/12* (2006.01)
*H03L 3/00* (2006.01)
*H03L 5/00* (2006.01)
*H03L 5/02* (2006.01)
*H03L 7/24* (2006.01)
*H04B 1/06* (2006.01)
*H04B 1/10* (2006.01)

(52) U.S. Cl. ....... 331/48; 331/55; 331/117 FE; 331/173; 331/177 V; 455/256

(58) Field of Classification Search .......... 331/46, 331/48, 55, 117 R, 117 FE, 117 D, 172, 177 R, 331/177 V; 455/255, 256
See application file for complete search history.

(56) References Cited

U.S. PATENT DOCUMENTS 7,199,675 B2 * 4/2007 Lee et al. ............... 331/117 FE

FOREIGN PATENT DOCUMENTS

WO 2009/104839 A1 8/2009
WO 2011/031389 A2 3/2011

OTHER PUBLICATIONS

Park et al., "Current Reusing VCO and Divide-by-Two Frequency Divider for Quadrature LO Generation", IEEE Microwave and Wireless Components Letters ; vol. 18(6), (Jun. 2008),pp. 413-415. Abstract Only.
Oh et al., "Current Reused LC VCOs", IEEE Microwave and Wireless Com Ponents Letters ; vol. 15(11), See abstract, figures 1,3 and corresponding detai led description.,(Nov. 2005),pp. 736-738. Abstract Only.
Lee et al., "A Low Power Injection Locked LC-Tank Oscillator With Current Reused Topology", IEEE Microwave and Wireless Components Letters, vol. 17(3), (Mar. 2007),pp. 220-222. Abstract Only.
Hsieh et al., "Design of Ultra-Low-Voltage RF Frontends With Complementary Current-Reused Architectures", IEEE Transactions on Microwave Theory and Techniques, vol. 55(7), (Jul. 2007), pp. 1445-1458. Abstract Only.
International Search Report and Written Opinion received for PCT Application No. PCT/US2010/044100, mailed on Mar. 30, 2011,10 pgs.

* cited by examiner

*Primary Examiner* — David Mis
(74) *Attorney, Agent, or Firm* — Thorpe North & Western LLP

(57) ABSTRACT

Embodiments of the present invention include a low phase noise oscillator circuit using a current-reuse technique to reduce power consumption and improve phase noise, where the oscillator circuit comprises a first VCO coupled to a second VCO, and the outputs of the first and second VCOs are coupled with passive elements, such as capacitors. The overall power consumption of both the first and second VCOs is about the same as a single VCO. Furthermore, the phase noise is lowered by around 3 dB. Thus, the phase noise performance is improved without increasing the power consumption of the oscillator circuit.

21 Claims, 5 Drawing Sheets

LOW PHASE NOISE VOLTAGE CONTROLLED OSCILLATOR

BACKGROUND

1. Field

One or more embodiments of the present invention relate to the field of electronic circuits and systems and more particularly to voltage controlled oscillator circuits.

2. Discussion of Related Art

A voltage controlled oscillator (VCO) is a circuit that receives a control voltage and generates an output signal with a frequency that is a function of the control voltage. Fluctuations in the output signal of the VCO results in phase noise that is undesirable for the system.

In high linearity radio receivers, reciprocal mixing affects the signal-to-noise ratio (SNR) and degrades the sensitivity of the receiver. Reciprocal mixing may occur when the phase noise over 50 MHz away mixes with blockers, which are undesired large signals from external sources. These blockers degrade the SNR and as a result limit the sensitivity of the receiver.

Typically, far-out phase noise in a VCO can be reduced by doubling the DC power/current while lowering the load resistance. As a result, the SNR improves by 3 dB for each doubling of power under ideal conditions. However, this increases the power dissipation of the VCO.

DETAILED DESCRIPTION

In the following description, numerous specific details are set forth in order to provide a thorough understanding of one or more embodiments of the present invention. In other instances, well known electronic device functionality and features have not been described in particular detail in order not to unnecessarily obscure this detailed description.

Embodiments of the present invention describe a voltage controlled oscillator (VCO) circuit that utilizes a current re-use technique to reduce power consumption and phase noise. The VCO circuit comprises a first VCO coupled to a second VCO. The outputs of the first and second VCOs are coupled with passive elements, such as capacitors. By coupling the first VCO to the second VCO in series, the second VCO receives substantially the same amount of the supply current flowing through the first VCO. As a result, the overall power consumption of both the first and second VCOs is about the same as a single VCO. Furthermore, the phase noise is lowered by around 3 dB. Thus, the phase noise performance is improved without increasing the power consumption of the VCO circuit.

Figure 1:
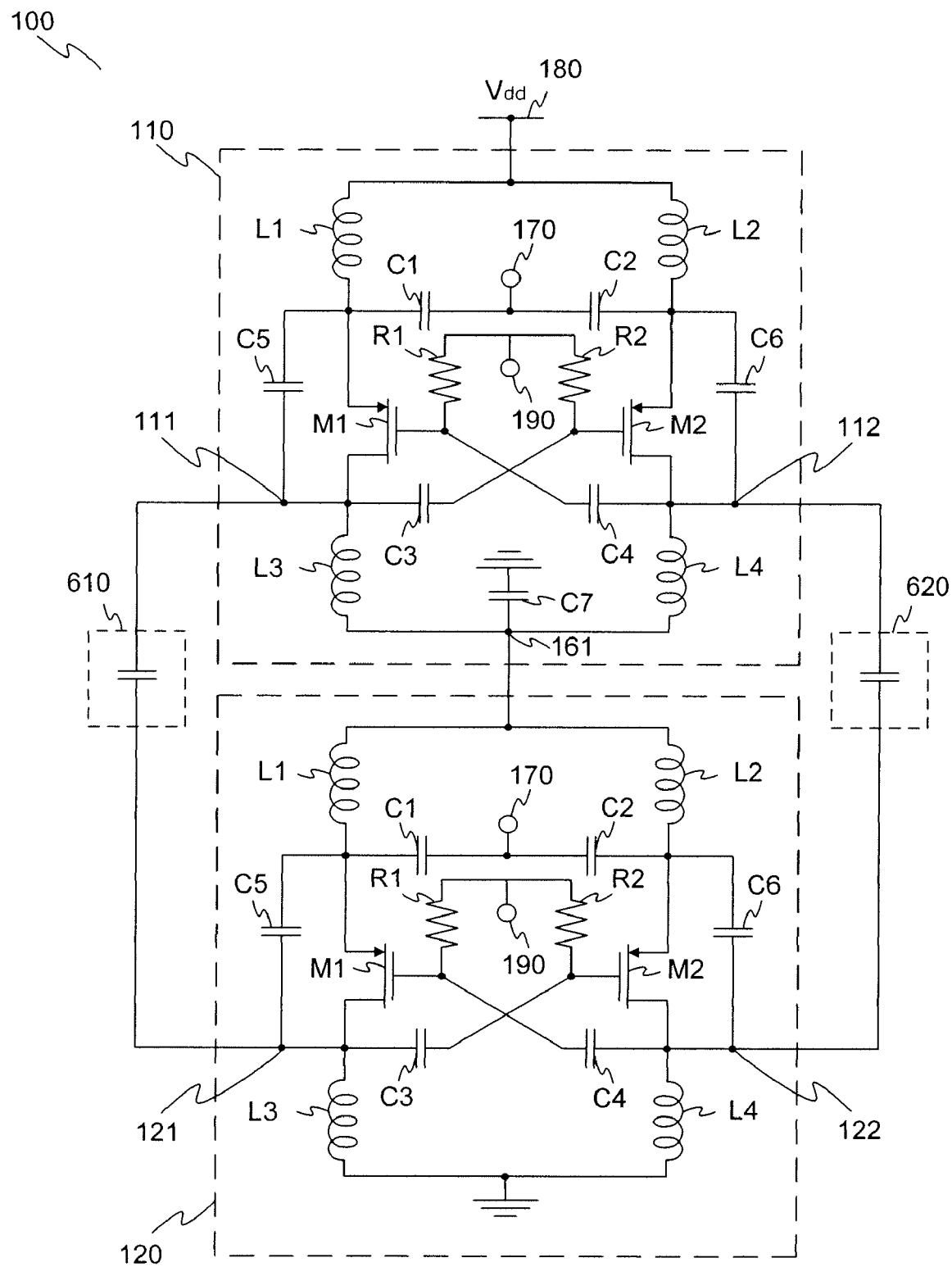
FIG. 1 is a schematic diagram that illustrates a voltage controlled oscillator circuit in accordance with one embodiment of the present invention.

FIG. 1 is a schematic diagram of a voltage controlled oscillator (VCO) circuit 100. In an embodiment of the present invention, the VCO circuit 100 comprises a first VCO 110 coupled to a second VCO 120 in series for current re-use to reduce power consumption. In addition, the phase noise is also reduced.

In an embodiment of the present invention, the first VCO 110 comprises a first transistor M1 coupled to a second transistor M2. In one embodiment, the first and second transistors M1, M2 are PMOS transistors. The source terminals of the first and second transistors M1, M2 are coupled to a voltage supply terminal 180 to receive a low supply voltage Vdd. In one embodiment, the low supply voltage Vdd has a range of 1.0-1.5V, preferably around 1.2V. In one embodiment, a first inductor L1 couples the source terminal of the first transistor M1 to the voltage supply terminal 180. Similarly, a second inductor L2 couples the source terminal of the second transistor M2 to the voltage supply terminal 180.

In one embodiment, a first capacitor C1 couples the source terminal of the first transistor M1 to a tuning voltage node 170 for biasing the first VCO 110. A second capacitor C2 couples the source terminal of the second transistor M2 to the tuning voltage node 170. In one embodiment, the first and second capacitors C1, C2 comprises capacitors having variable capacitance, which are also known as varactors.

The drain terminal of the first transistor M1 is coupled to the gate terminal of the second transistor M2. In one embodiment, a third capacitor C3 couples the drain terminal of the first transistor M1 to the gate terminal of the second transistor M2. The gate terminal of the first transistor M1 is coupled to the drain terminal of the second transistor M2. In one embodiment, a fourth capacitor C4 couples the gate terminal of the first transistor M1 to the drain terminal of the second transistor M2.

In one embodiment, a fifth capacitor C5 couples the drain terminal of the first transistor M1 to its source terminal. Similarly, a sixth capacitor C6 couples the drain terminal of the second transistor M2 to its source terminal.

In one embodiment, the drain terminals of the first and second transistors M1, M2 are coupled to each other at a common drain node 161. In one embodiment, a third inductor L3 couples the drain terminal of the first transistor M1 to the common drain node 161. A fourth inductor L4 couples the drain terminal of the second transistor M2 to the common drain node 161. In an embodiment of the present invention, a seventh capacitor C7 couples the common drain node 161 to a ground terminal. In one embodiment, the seventh capacitor is a bypass capacitor.

In an embodiment of the present invention, the gate terminals of the first and second transistors M1, M2 are coupled to a bias node 190 for receiving a bias voltage. In one embodiment, a first resistor R1 couples the gate terminal of the first transistor M1 to the bias node 190. A second resistor R2 couples the gate terminal of the second transistor M2 to the bias node 190.

The first VCO 110 further comprises a differential output having a first output 111 and a second output 112. In one embodiment, the drain terminals of the first and second transistors function as the first output 111 and the second output 112.

The second VCO 120 has similar configuration as the first VCO 110, and thus will not be discussed in detail. Briefly, the second VCO 120 also comprises a first transistor M1 coupled to a second transistor M2. The source terminals of the first and second transistors M1, M2 of the second VCO 120 are coupled to each other. In one embodiment, the source terminals of the first and second transistors M1, M2 of the second VCO 120 are coupled to common drain node 161 of the first VCO 110. The gate terminal of the first transistor M1 is coupled to the drain terminal of the second transistor M2. Similarly, the gate terminal of the second transistor M2 is coupled to the drain terminal of the first transistor M1.

The second VCO 120 comprises a differential output having a first output 121 and a second output 122. In one embodiment, the drain terminals of the first and second transistors M1, M2 of the second VCO 120 function as the first output 121 and the second output 122 of the second VCO 120.

The VCO circuit 100 further comprises a first passive element 610 coupling the first output 111 of the first VCO 110 to the first output 121 of the second VCO 120. In a specific embodiment, the first passive element 610 comprises a capacitor coupling the drain terminal of the first transistor M1 of the first VCO 110 to the drain terminal of the first transistor M1 of the second VCO 120.

A second passive element 620 couples the second output 112 of the first VCO 110 to the second output 122 of the second VCO 120. In a specific embodiment, the second passive element 620 comprises a capacitor coupling the drain terminal of the second transistor M2 of the first VCO 110 to the drain terminal of the second transistor M2 of the second VCO 120. The capacitor values of the first and second passive elements 610, 620 are selected from a range that is sufficient to reduce phase noise without increasing the parasitic capacitance. In one embodiment, the capacitor values of the first and second passive elements 611, 612 is less than 1 pF when the VCO circuit 100 has a operating frequency of about 10-12 GHz. In a specific embodiment, the capacitor values of the first and second passive elements 611, 612 is about 200-600 fF.

In an embodiment of the present invention, the first and second outputs 111, 112 of the first VCO 110 function as the differential output of the overall VCO circuit 100. Alternatively, the first and second outputs 121, 122 of the second VCO 120 function as the differential output of the VCO circuit 100.

One advantage of the VCO circuit 100 is achieving low power consumption while improving the signal-to-noise ratio (SNR). In the VCO circuit 100, the first VCO 110 and the second VCO 120 share the supply current Idd from the low supply voltage Vdd at the voltage supply terminal 180. In other words, the second VCO 120 receives substantially the same amount of the supply current Idd flowing through the first VCO 110. As a result, the overall power consumption of both the first and second VCO 110, 120 is about the same as a single VCO. Furthermore, by coupling the first VCO 110 to the second VCO 120, the phase noise is reduced by around 3 dB. Hence, the SNR improves by 3 dB without increasing the power consumption of the VCO circuit 100. The first and second VCO 110, 120 are each designed to operate at around 0.5-0.6V with very low phase noise. In contrast, the conventional VCO requires a larger voltage and/or employs a linear regulator to reduce the supply voltage.

Figure 6:
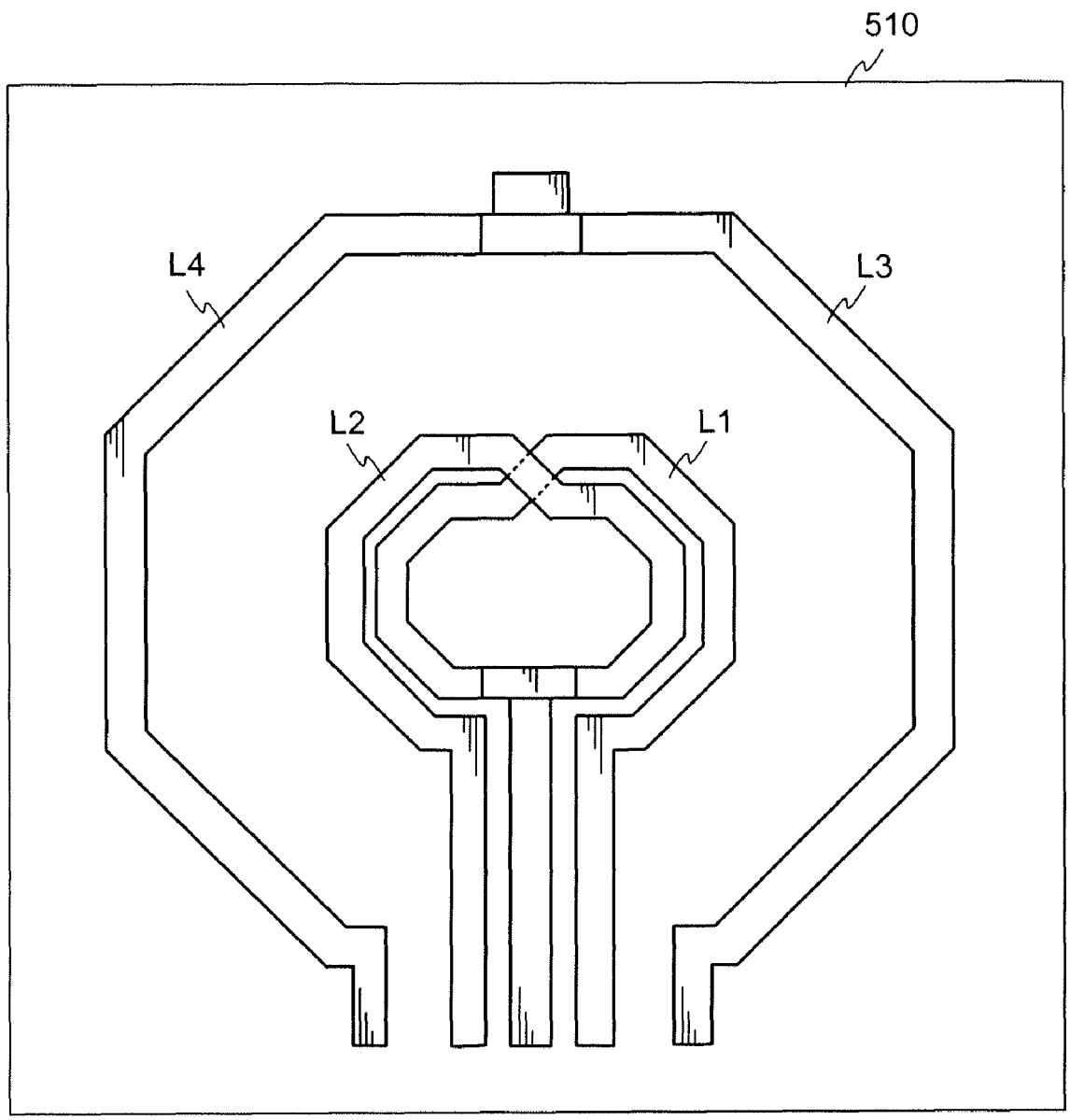
FIG. 6 is a top plan view of arrangement of the inductors in accordance with one embodiment of the present invention.

The VCO circuit 100 uses multiple inductors L1, L2, L3, L4, which require large die area. In one embodiment, the less critical inductors are arranged within the main frequency setting inductors so as to reuse the same die area. FIG. 6 illustrates a top plan view of the inductors L1, L2, L3, L4 that are formed on a substrate 510. In an embodiment of the present invention, the inductors L3, L4 are formed around the inductors L1, L2.

It can be appreciated that the first and second transistors M1, M2 in the first VCO 110 or second VCO 120 are not limited to using PMOS transistors. In other embodiments, the first and second transistors M1, M2 uses other types of transistors such as but not limited to NMOS transistors, bipolar junction transistors, or their combinations.

It can be appreciated that the VCO circuit 100 is not limited to only two oscillators (i.e. the first and second VCOs 110, 120). Additional oscillators can be added into the VCO circuit 100 to further improve the phase noise. For example, an additional oscillator can be coupled to the second VCO 120 in series. The outputs of the additional oscillator and the second VCO 120 can be coupled in the same manner as the first and second VCOs 110, 120 shown in FIG. 1. Accordingly, the supply voltage Vdd can be increased so that it is sufficient to operate the additional oscillator.

Figure 2:
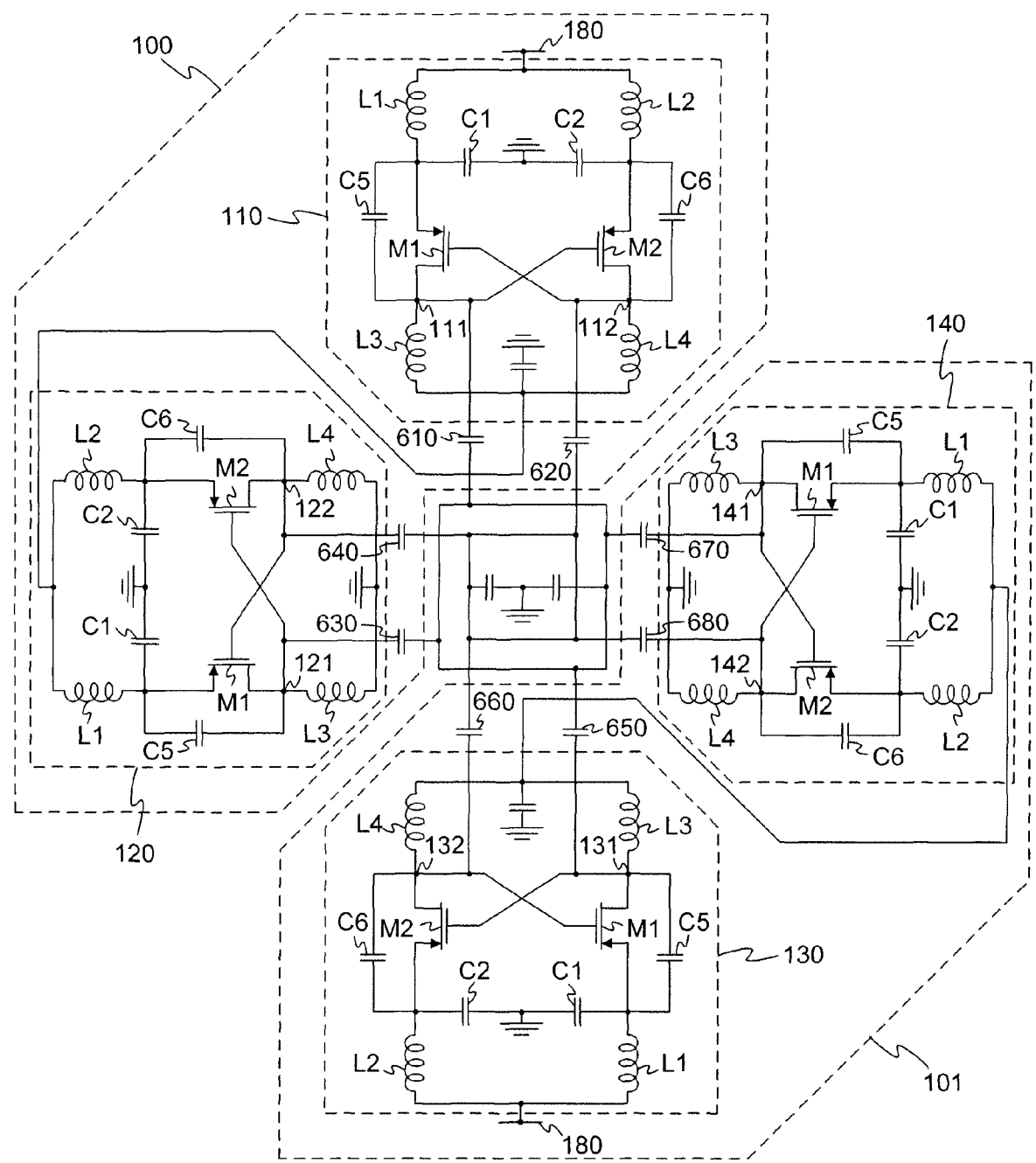
FIG. 2 is a schematic diagram that illustrates a voltage controlled oscillator circuit in accordance with another embodiment of the present invention.

In another embodiment of the present invention, an additional VCO circuit is coupled to the VCO circuit 100 of FIG. 1 to further reduce the phase noise. FIG. 2 is a schematic diagram illustrating the VCO circuit 100 coupled to another VCO circuit 101, the VCO circuit 101 having a similar configuration as the VCO circuit 100.

The first and second outputs 111, 112 of the first VCO 110 are similarly coupled to the first and second outputs 121, 122 of the second VCO 120. In an embodiment of the present invention, the first output 111 of the first VCO 110 is coupled to the first passive element 610. A third passive element 630 couples the first output 121 of the second VCO 120 to the first passive element 610. The second output 112 of the first VCO 110 is coupled to the second passive element 620. A fourth passive element 640 couples the second output 122 of the second VCO 120 to the second passive element 620.

In one embodiment, the first, second, third and fourth passive elements 610, 620, 630, 640 each comprises a capacitor having a range of capacitance that is sufficient to reduce phase noise without increasing the parasitic capacitance. In a specific embodiment, the capacitor value of the first, second, third and fourth passive elements 610, 620, 630, 640 is less than 1 pF when the VCO circuit 100 has a operating frequency of about 10-12 GHz.

The additional VCO circuit 101 comprises a third VCO 130 coupled to a fourth VCO 140 in series. The third VCO 130 and the fourth VCO 140 have similar configurations as the first VCO 110 and second VCO 120, and thus will not be discussed in detail herein. In an embodiment of the present invention, the third VCO 130 comprises a first output 131 and a second output 132. In one embodiment, the drain terminals of the first and second transistors M1, M2 of the third VCO 130 function as the first and second outputs 131, 132.

The first output 131 of the third VCO 130 is coupled to the first outputs 111, 121 of the first and second VCOs 110, 120. In one embodiment, a fifth passive element 650 couples the first output 131 of the third VCO 130 to the first and third passive elements 610, 630. Similarly, a sixth passive element 660 couples the second output 132 of the third VCO 130 to the second and fourth passive elements 620, 640.

The fourth VCO 140 comprises a first output 141 and a second output 142. In one embodiment, the drain terminals of the first and second transistors M1, M2 of the fourth VCO 140 function as the first and second outputs 141, 142.

The first output 141 of the fourth VCO 140 is coupled to the first outputs 111, 121, 131 of the first, second and third VCOs 110, 120, 130. In one embodiment, a seventh passive element 670 couples the first output 141 of the fourth VCO 140 to the first, third, and fifth passive elements 610, 630, 650. Similarly, an eighth passive element 680 couples the second output 142 of the fourth VCO 140 to the second, fourth and sixth passive elements 620, 640, 660. Hence, the outputs of the VCO circuits 100, 101 are coupled in parallel. In other words, the first outputs 111, 121, 131, 141 of the first, second, third and fourth VCOs 110, 120, 130, 140 are coupled to each other while the second outputs 112, 122, 132, 142 are coupled to each other.

In an embodiment of the present invention, the fifth, sixth, seventh and eighth passive elements 650, 660, 670, 680 each comprises a capacitor having a range of capacitance that is sufficient to reduce phase noise without increasing the parasitic capacitance. In a specific embodiment, the capacitor value of the fifth, sixth, seventh and eighth passive elements 650, 660, 670, 680 is less than 1 pF when the VCO circuit 101 has a operating frequency of about 10-12 GHz.

An advantage of coupling the two VCO circuits 100, 101 is the improvement in the SNR. By coupling an additional VCO circuit 101 to the VCO circuit 100, the SNR is further reduced by around 3 dB.

Figure 3:
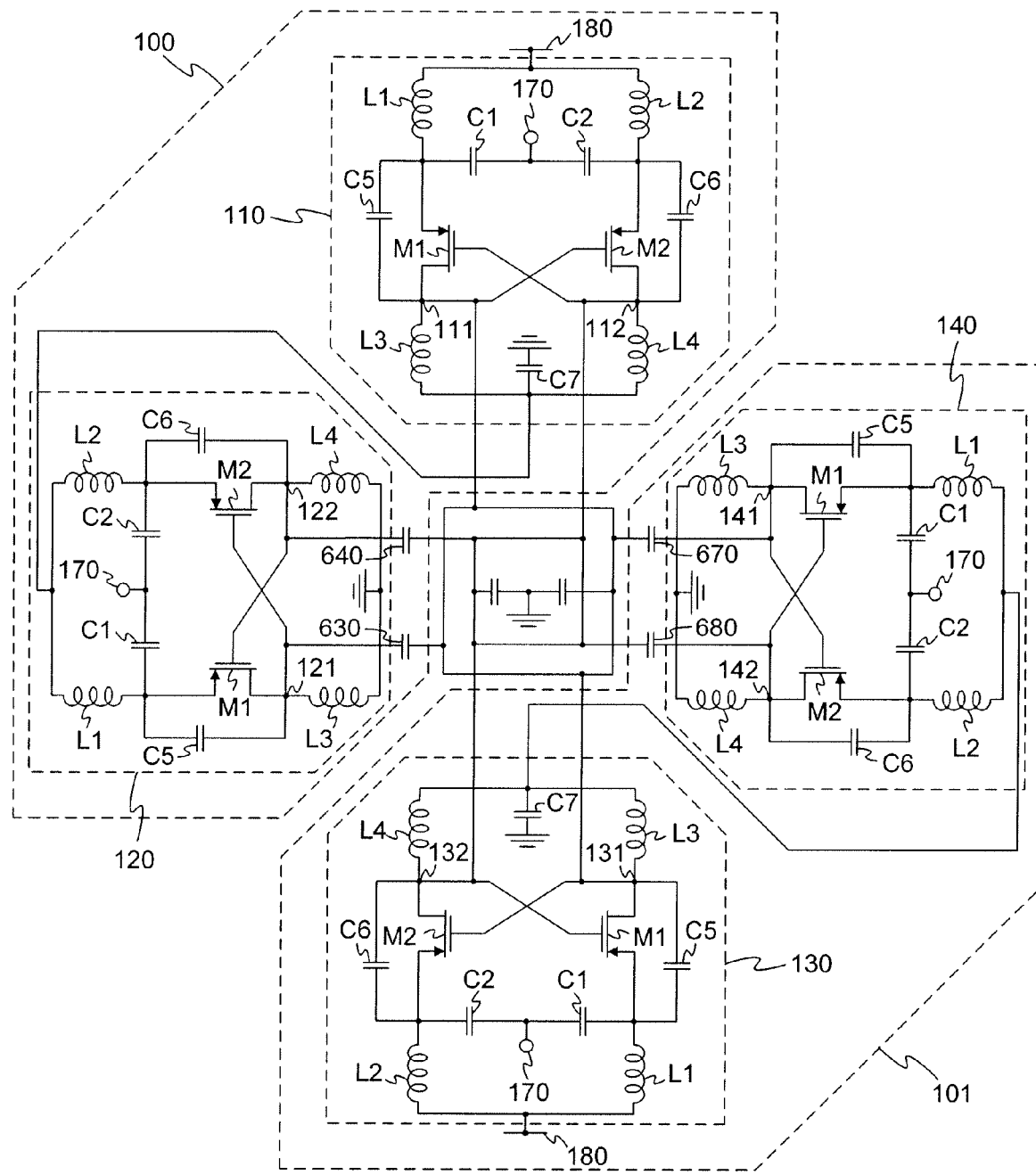
FIG. 3 is a schematic diagram that illustrates a voltage controlled oscillator circuit in accordance with yet another embodiment of the present invention.

In an embodiment of the present invention, the outputs of the first VCO 110 and third VCO 130 are DC coupled together instead of capacitively coupled because the first VCO and third VCO are operating at substantially the same DC potential. In other words, the outputs 111, 112 of the first VCO 110 are directly coupled to the outputs 131, 132 of the third VCO 130 without passive elements 610, 620, 650, 660 as illustrated in FIG. 3. In this case, the third passive element 630 couples the first output 121 of the second VCO 120 directly to the first output 111 of the first VCO 110. The fourth passive element 640 couples the second output 122 of the second VCO 120 directly to the second output 112 of the first VCO 110. Similarly, the seventh passive element 670 couples the first output 141 of the fourth VCO directly to the first output of the 131 of the third VCO 130. The eighth passive element 680 couples the second output 142 of the fourth VCO 140 directly to the second output 132 of the third VCO 130.

Alternatively, the outputs of the second VCO 120 and the fourth VCO 140 are directly coupled together without using passive elements because the second VCO 120 and the fourth VCO 140 are operating at substantially the same DC potential (not shown). In this case, the output 121 is directly coupled to the output 141 without the passive elements 630, 670, and the output 122 is directly coupled to the output 142 without the passive elements 640, 680.

In an embodiment of the present invention, the output voltage of the VCO circuit 100 is regulated to improve or stabilize the phase noise performance. During operation, temperature fluctuations or changes in the transistors characteristics may affect the output voltage amplitude of the VCO circuit 100, which causes inconsistent phase noise performance. In one embodiment, a constant output voltage amplitude is achieved by varying the supply voltage Vdd received by the VCO circuit 100.

Figure 4:
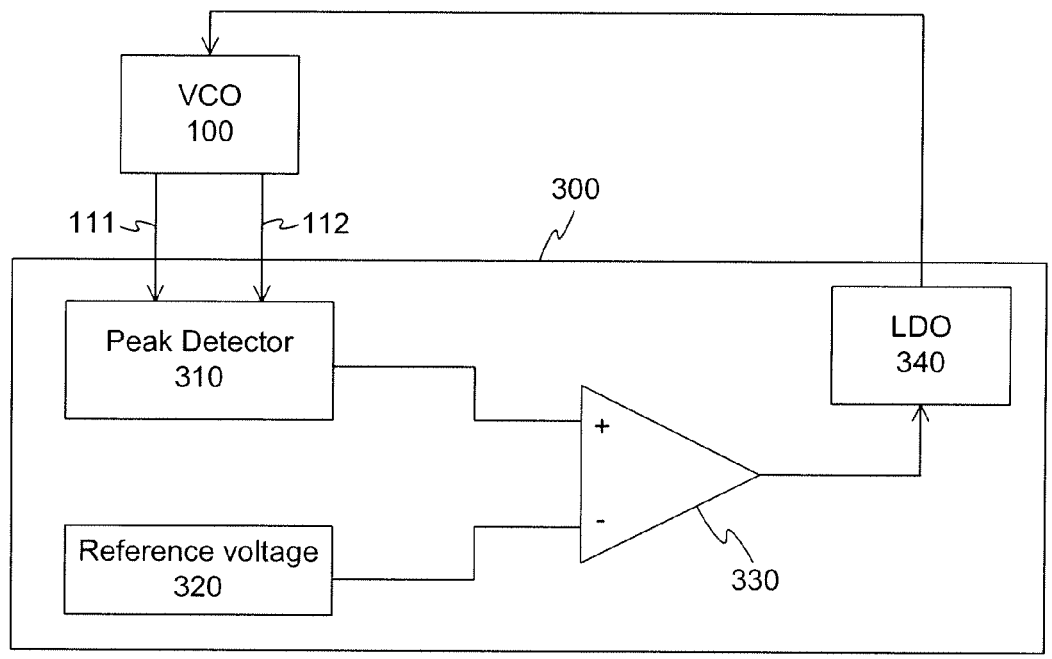
FIG. 4 is a block diagram that illustrates a voltage controlled oscillator circuit coupled to a regulating module in accordance with one embodiment of the present invention.

FIG. 4 is a block diagram that illustrates the VCO circuit 100 coupled to a regulating module 300 for regulating the differential output of the VCO circuit 100 so as to achieve constant output voltage amplitude. In an embodiment of the present invention, the regulating module 300 comprises a peak detector 310 coupled to the VCO circuit 100. In one embodiment, the differential outputs 111, 121 of the VCO circuit 100 are coupled to the peak detector 310. The peak detector 310 detects or senses the output voltage amplitude of the VCO circuit 100 and sends a corresponding peak voltage to a comparator 330. In one embodiment, the comparator 330 comprises an operational amplifier. The comparator 330 compares the peak voltage of the peak detector 310 to a reference voltage 320 and sends a control signal to a low dropout regulator (LDO) 340 to regulate the output voltage of the LDO 340.

Typically, the LDO 340 operates from a raw 1.5V voltage supply from a high-efficiency switching regulator in the system. Depending on the control signal from the comparator 330, the LDO 340 varies or adjusts its output voltage transmitted to the VCO circuit 100. In the case where the VCO circuit 100 operates on a supply voltage Vdd of around 1.2V, the output voltage of the LDO 340 to the VCO circuit 100 varies from about 1.1V to 1.3V. Hence, the supply voltage Vdd is increased or decreased over the range of 1.1V to 1.3V to maintain a relatively constant output voltage amplitude of the VCO circuit 100, which results in substantially constant phase noise performance.

The regulating module 300 shown in FIG. 4 regulates the output voltage of the VCO circuit 100 in a continuous-time manner by utilizing the peak detector 310 to continuously detect the output voltage amplitude. In an alternative embodiment, the regulating module 300 comprises a state machine and a digital-to-analog convertor (DAC) that sequences discrete changes in the output voltage to the VCO circuit 100. This results in less noise in the VCO circuit 100 and/or acceptable noise levels at lower power.

During operation of a radio device, reciprocal mixing may occur due to the mixing of the phase noise with blockers. In this case, the blocker refers to interferers from adjacent channel or out of channel signals from other radio sources. Consequently, the reciprocal mixing affects the signal-to-noise ratio (SNR) and degrades the sensitivity of the radio device. In an embodiment of the present invention, a blocker sensing means is used to activate the VCO circuit 100 when a blocker is detected. In an embodiment of the present invention, the blocker sensing means is used to detect blockers that are present in high frequencies, for example 50 MHz or more away from the wanted signal.

Figure 5:
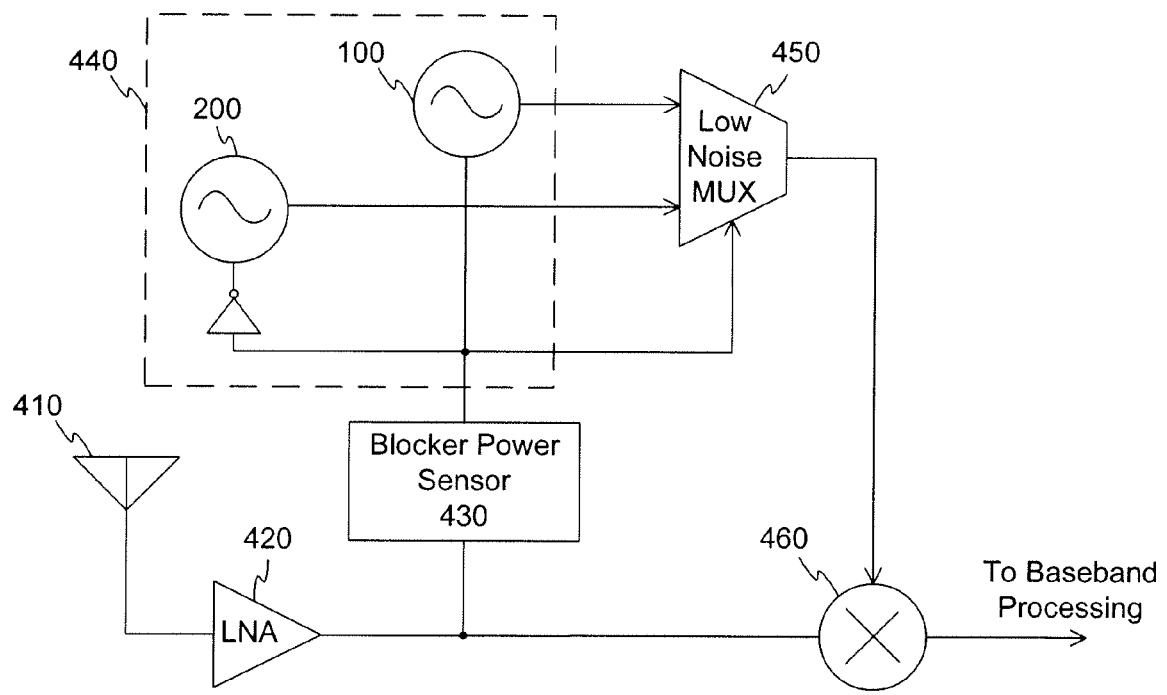
FIG. 5 is a block diagram that illustrates a front-end portion of radio device in accordance with one embodiment of the present invention.

FIG. 5 illustrates the front end portion of a radio device in accordance with one embodiment of the present invention. In one embodiment, the radio device comprises an antenna 410 coupled to a low noise amplifier (LNA) 420. A blocker power sensor 430 is coupled to the LNA 420 to detect the presence of blockers or interfering signals from the output of the LNA 420. In one embodiment, the blocker power sensor 430 comprises a peak detector or a spectrum analyzer well known in the art for detecting the blockers.

The blocker power sensor 430 is coupled to a frequency synthesizer module 440 that includes the VCO circuit 100 and a low power oscillator 200 that is operating at a lower power than the VCO circuit 100. During operation, the blocker power sensor 430 activates the lower power oscillator 200 when blockers are not detected. On the other hand, the blocker power sensor 430 activates the VCO circuit 100 when it detects blockers, of insufficient amplitude that could lead to reciprocal mixing. In other words, the VCO circuit 100 is deactivated in the absence of blockers so as to reduce the power consumption of the radio device.

The radio device further comprises a low noise multiplexer (MUX) 450 coupled to the blocker power sensor 430, the VCO circuit 100 and the low power oscillator 200. A mixer 460 is coupled to the low noise MUX 450 and LNA 420.

Typical radio receivers use pre-select filters for attenuating undesired signals at high frequencies. These pre-select filters take up space, are expensive and have an insertion loss of around 2 dB, which degrades the sensitivity of the radio receiver. One advantage of implementing the VCO circuit 100 in the radio device is the lowering of phase noise, which eliminates the use of pre-select filters in a high-linearity radio device.

In an embodiment of the present invention, the VCO circuit 100 and the blocker power sensor 430 can be used for a low jitter clock for a continuous time (CT) sigma delta analog-to-digital converter (ADC). CT sigma delta ADCs are generally sensitive to clock jitter. CT sigma delta ADCs have the advantages of achieving high dynamic range at low power and smaller die area compared to discrete time sigma delta ADCs.

Several embodiments of the invention have thus been described. However, those ordinarily skilled in the art will recognize that the invention is not limited to the embodiments described, but can be practiced with modification and alteration within the spirit and scope of the appended claims that follow.

We claim:

1. An oscillator circuit comprising:
a first voltage controlled oscillator (VCO) to receive a supply voltage, the first VCO comprising a first output and a second output;
a second VCO coupled to the first VCO to receive the supply current of the supply voltage, the second VCO comprising a first output and a second output;
a first passive element coupling the first output of the first VCO to the first output of the second VCO;
a second passive element coupling the second output of the first VCO to the second output of the second VCO; and
a differential output comprising either the first and second outputs of the first VCO or the first and second outputs of the second VCO.

2. The oscillator circuit of claim 1, wherein the first VCO further comprises a first transistor and a second transistor,
the source terminals of the first and second transistors are coupled to a voltage supply terminal, the voltage supply terminal to receive the supply voltage,
the gate terminal of the first transistor is coupled to the drain terminal of the second transistor,
the gate terminal of second transistor is coupled to the drain terminal of the first transistor, and
the drain terminals of the first transistor and the second transistor are coupled to a common drain node.

3. The oscillator circuit of claim 2, wherein the second VCO further comprises a first transistor and a second transistor,
the source terminals of the first and second transistors of the second VCO are coupled to the common drain node of the first VCO,
the gate terminal of the first transistor of the second VCO is coupled to the drain terminal of the second transistor of the second VCO, and
the gate terminal of second transistor of the second VCO is coupled to the drain terminal of the first transistor of the second VCO.

4. The oscillator circuit of claim 3,
wherein the first passive element comprises a capacitor coupling the drain terminal of the first transistor of the first VCO to the drain terminal of the first transistor of the second VCO; and
wherein the second passive element comprises a capacitor coupling the drain terminal of the second transistor of the first VCO to the drain terminal of the second transistor of the second VCO.

5. The oscillator circuit of claim 2, wherein the first VCO further comprises:
a first inductor coupling the source terminal of the first transistor to the voltage supply terminal;
a second inductor coupling the source terminal of the second transistor to the voltage supply terminal;
a third inductor coupling drain terminal of the first transistor to the common drain node; and
a fourth inductor coupling the drain terminal of the second transistor to the common drain node.

6. The oscillator circuit of claim 5,
wherein the first, second, third and fourth inductors of the first VCO are formed on a substrate, and
wherein the third and fourth inductors are formed around the first and second inductors.

7. The oscillator circuit of claim 5, wherein the second VCO further comprises:
a first inductor coupling the source terminal of the first transistor to the common drain node of the first VCO;
a second inductor coupling the source terminal of the second transistor to the common drain node of the first VCO;
a third inductor coupling drain terminal of the first transistor to a ground terminal; and
a fourth inductor coupling the drain terminal of the second transistor to the ground terminal.

8. The oscillator circuit of claim 7,
wherein the first, second, third and fourth inductors of the second VCO are formed on a substrate, and
wherein the third and fourth inductors are formed around the first and second inductors.

9. The oscillator circuit of claim 1, further comprising:
a third VCO to receive the supply voltage, the third VCO comprising a first output and a second output;
a fourth VCO coupled to the third VCO to receive the supply current of the supply voltage, the fourth VCO comprising a first output and a second output.

10. The oscillator circuit of claim 9, further comprising:
a third passive element coupling the first output of the second VCO to the first passive element; and
a fourth passive element coupling the second output of the second VCO to the second passive element.

11. The oscillator circuit of claim 9, further comprising:
a fifth passive element coupling the first output of the third VCO to the first output of the fourth VCO, the fifth passive element coupling the first output of the third VCO to the first passive element; and
a sixth passive element coupling the second output of the third VCO to the second output of the fourth VCO, the sixth passive element coupling the second output of the third VCO to the second passive element.

12. The oscillator circuit of claim 11, further comprising:
a seventh passive element coupling the first output of the fourth VCO to the fifth passive element; and
an eighth passive element coupling the second output of the fourth VCO to the sixth passive element.

13. The oscillator circuit of claim 1, wherein the supply voltage is regulated to maintain constant output voltage amplitude at the differential output.

14. A radio device comprising:
an antenna;
a low noise amplifier coupled to the antenna;
a blocker power sensor coupled to the low noise amplifier, the blocker power sensor operable to detect an interfering signal;
a frequency synthesizer module coupled to the blocker power sensor, the frequency synthesizer comprising a first oscillator and a second oscillator, second oscillator to operate at a lower power than the first oscillator, the first oscillator comprising:

a first voltage controlled oscillator (VCO) comprising a first output and a second output;

a second VCO comprising a first output and a second output;

a first passive element coupling the first output of the first VCO to the first output of the second VCO;

a second passive element coupling the second output of the VCO oscillator to the second output of the second VCO; and a differential output comprising either the first and second outputs of the first VCO or the first and second outputs of the second VCO; and wherein the block power sensor activates the first VCO if the interfering signal is detected.

15. The radio device of claim 14, wherein the blocker power sensor activates the second VCO if the interfering signal is not detected.

16. The radio device of claim 14 further comprising a multiplexer coupled to the blocker power sensor, the first oscillator, and the second oscillator.

17. The radio device of claim 16 further comprising a mixer coupled to the multiplexer and the low noise amplifier.

18. The radio device of claim 14 further comprising:

a peak detector coupled to the differential output of the first VCO for detecting the output voltage amplitude of the differential output;

an operational amplifier coupled to the peak detector for comparing the output voltage amplitude of the differential output to a reference voltage so as to transmit a control signal; and a regulator coupled to the operational amplifier and the first oscillator, wherein the regulator is operable to receive the control signal from the operational amplifier and adjust an output voltage that is transmitted to the first VCO.

19. The radio device of claim 14, wherein the first VCO further comprises a first transistor and a second transistor, the source terminals of the first and second transistors are coupled to a voltage supply terminal, the voltage supply terminal to receive the supply voltage, the gate terminal of the first transistor is coupled to the drain terminal of the second transistor, and the gate terminal of the second transistor is coupled to the drain terminal of the first transistor the drain terminals of the first transistor and the second transistor are coupled to a common drain node.

20. The radio device of claim 19, wherein the second VCO further comprises a first transistor and a second transistor, the source terminals of the first and second transistors of the second VCO are coupled to the common drain node of the first VCO, the gate terminal of the first transistor of the second VCO is coupled to the drain terminal of the second transistor of the second VCO, and the gate terminal of second transistor of the second VCO is coupled to the drain terminal of the first transistor of the second VCO.

21. The radio device of claim 20, wherein the first passive element comprises a capacitor coupling the drain terminal of the first transistor of the first VCO to the drain terminal of the first transistor of the second VCO; and wherein the second passive element comprises a capacitor coupling the drain terminal of the second transistor of the first VCO to the drain terminal of the second transistor of the second VCO.

* * * * *